United States Patent
Gopinath et al.

(10) Patent No.: US 12,376,315 B2
(45) Date of Patent: Jul. 29, 2025

(54) RESISTIVE MEMORY ELEMENT ARRAYS WITH SHARED ELECTRODE STRIPS

(71) Applicant: GlobalFoundries U.S. Inc., Malta, NY (US)

(72) Inventors: Venkatesh Gopinath, Fremont, CA (US); Bipul C. Paul, Mechanicville, NY (US); Xiaoli Hu, Shanghai (CN)

(73) Assignee: GlobalFoundries U.S. Inc., Malta, NY (US)

( * ) Notice: Subject to any disclaimer, the term of this patent is extended or adjusted under 35 U.S.C. 154(b) by 536 days.

(21) Appl. No.: 17/866,756

(22) Filed: Jul. 18, 2022

(65) Prior Publication Data

US 2024/0023345 A1   Jan. 18, 2024

(51) Int. Cl.
*H10B 63/00* (2023.01)
*G11C 13/00* (2006.01)
*H10N 70/20* (2023.01)

(52) U.S. Cl.
CPC ......... *H10B 63/82* (2023.02); *G11C 13/0026* (2013.01); *G11C 13/0028* (2013.01);
(Continued)

(58) Field of Classification Search
CPC ........ H10B 63/82; H10B 63/34; H10B 63/30; G11C 13/0026; G11C 13/0028; G11C 13/0069; H10N 70/253; H10N 70/245; H10N 70/826; H10N 70/883; H10N 70/8833; H10N 70/011; H10N 70/841; H10N 79/00
See application file for complete search history.

(56) References Cited

U.S. PATENT DOCUMENTS 7,560,724 B2 * 7/2009 Aratani ............. H10N 70/8845
257/3
7,977,661 B2 * 7/2011 Philipp ............. H10N 70/8828
257/3
(Continued)

FOREIGN PATENT DOCUMENTS

FR           3096827 A1    12/2020

OTHER PUBLICATIONS

European Patent Office, Extended European Search Report and Opinion issued in European Patent Application No. 23179651.7 on Jan. 5, 2024; 7 pages.
(Continued)

*Primary Examiner* — Allison Bernstein
(74) *Attorney, Agent, or Firm* — Thompson Hine LLP

(57) ABSTRACT

Structures that include resistive memory elements and methods of forming a structure that includes resistive memory elements. The structure comprises a first plurality of resistive memory elements including a first plurality of bottom electrodes, a first top electrode, and a first switching layer between the first top electrode and the first plurality of bottom electrodes. The structure further comprises a second plurality of resistive memory elements including a second plurality of bottom electrodes, a second top electrode, and a second switching layer between the second top electrode and the second plurality of bottom electrodes. The first top electrode is shared by the first plurality of resistive memory elements, and the second top electrode is shared by the second plurality of resistive memory elements.

20 Claims, 5 Drawing Sheets

(52) U.S. Cl.
CPC ......... *G11C 13/0069* (2013.01); *H10B 63/34* (2023.02); *H10N 70/253* (2023.02)

(56) References Cited

U.S. PATENT DOCUMENTS

| | | |
|---|---|---|
| 9,461,245 B1 | 10/2016 | Yang et al. |
| 11,056,646 B2 | 7/2021 | Ramsbey et al. |
| 11,411,177 B2 | 8/2022 | Boivin et al. |
| 2005/0111247 A1 | 5/2005 | Takaura et al. |
| 2007/0086235 A1 | 4/2007 | Kim et al. |
| 2012/0091428 A1 | 4/2012 | Miyata |
| 2012/0127778 A1 | 5/2012 | Miyata et al. |
| 2014/0166961 A1 | 6/2014 | Liao et al. |
| 2017/0236869 A1 | 8/2017 | Tran et al. |
| 2024/0194535 A1* | 6/2024 | Gopinath ............. H10D 64/663 |

OTHER PUBLICATIONS

J. R. Jameson et al., "Conductive-bridge memory (CBRAM) with excellent high-temperature retention," 2013 IEEE International Electron Devices Meeting, pp. 30.1.1-30.1.4, doi: 10.1109/IEDM.2013.6724721 (2013).

F. Arnaud et al., "High Density Embedded PCM Cell in 28nm FDSOI Technology for Automotive Micro-Controller Applications," 2020 IEEE International Electron Devices Meeting (IEDM), pp. 24.2.1-24.2.4, doi: 10.1109/IEDM13553.2020.9371934 (2020).

F. Arnaud et al., "Truly Innovative 28nm FDSOI Technology for Automotive Micro-Controller Applications embedding 16MB Phase Change Memory," 2018 IEEE International Electron Devices Meeting (IEDM), pp. 18.4.1-18.4.4, doi: 10.1109/IEDM.2018.8614595 (2018).

* cited by examiner

RESISTIVE MEMORY ELEMENT ARRAYS WITH SHARED ELECTRODE STRIPS

BACKGROUND

This disclosure relates to integrated circuits and semiconductor device fabrication and, more specifically, to structures that include resistive memory elements and methods of forming a structure that includes resistive memory elements.

A resistive random-access memory device provides one type of embedded non-volatile memory technology. A bitcell of a resistive random-access memory device includes a resistive memory element and an access transistor that controls operations used to program the resistive memory element. Because resistive memory elements are non-volatile, bits of data are retained as stored content by the resistive memory elements when the resistive random-access memory device is not powered. The non-volatility of a resistive random-access memory device contrasts with volatile memory technologies, such as a static random-access memory device in which the stored content is eventually lost when unpowered and a dynamic random-access memory device in which the stored content is lost unless periodically refreshed.

A resistive memory element includes a switching layer that is positioned between a bottom electrode and a top electrode. The resistive memory element can be programmed by changing the resistance across the switching layer to provide different content-storage states, namely a high-resistance state and a low-resistance state, representing the stored bits of data. The switching layer can be modified by applying a programming voltage across the bottom and top electrodes that is sufficient to create one or more conductive filaments bridging across the thickness of the switching layer, which sets the low-resistance state. The conductive filaments may be formed, for example, by the diffusion of a conductive species (e.g., metal ions) from one or both of the electrodes into the switching layer. The conductive filaments can be destroyed, also by the application of a programming voltage, to reset the resistive memory element to the high-resistance state. The content-storage state can be read by measuring a voltage drop across the resistive memory element after it is programmed.

Improved structures including resistive memory elements and methods of forming a structure that includes resistive memory elements are needed.

SUMMARY

According to an embodiment of the invention, a structure comprises a first plurality of resistive memory elements including a first plurality of bottom electrodes, a first top electrode, and a first switching layer between the first top electrode and the first plurality of bottom electrodes. The structure further comprises a second plurality of resistive memory elements including a second plurality of bottom electrodes, a second top electrode, and a second switching layer between the second top electrode and the second plurality of bottom electrodes. The first top electrode is shared by the first plurality of resistive memory elements, and the second top electrode is shared by the second plurality of resistive memory elements.

According to another embodiment of the invention, a method comprises forming a first plurality of resistive memory elements including a first plurality of bottom electrodes, a first top electrode, and a first switching layer between the first top electrode and the first plurality of bottom electrodes. The method further comprises forming a second plurality of resistive memory elements including a second plurality of bottom electrodes, a second top electrode, and a second switching layer between the second top electrode and the second plurality of bottom electrodes. The first top electrode is shared by the first plurality of resistive memory elements, and the second top electrode is shared by the second plurality of resistive memory elements.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention. In the drawings, like reference numerals refer to like features in the various views.

DETAILED DESCRIPTION

Figure 1:
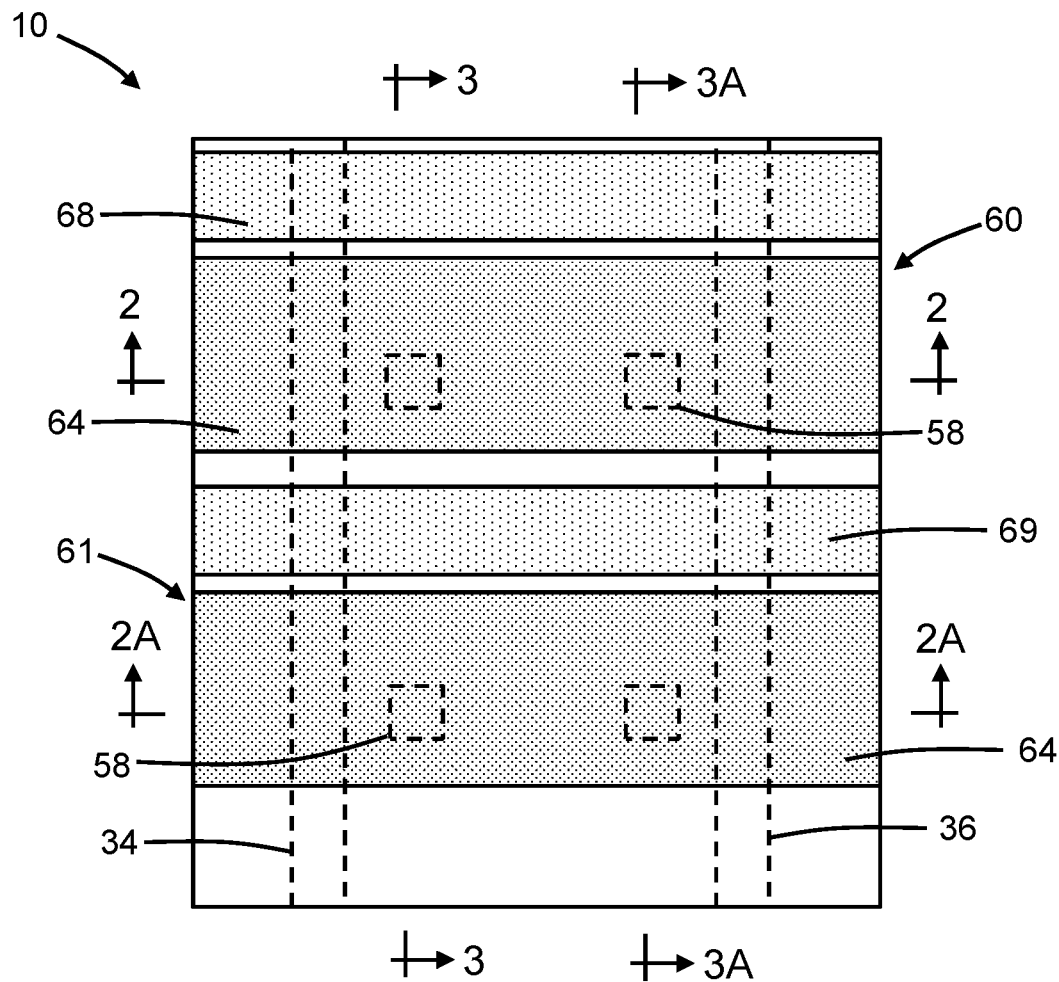
FIG. 1 is a diagrammatic top view illustrating a layout for an array of resistive memory elements in accordance with embodiments of the invention.
Figure 2:
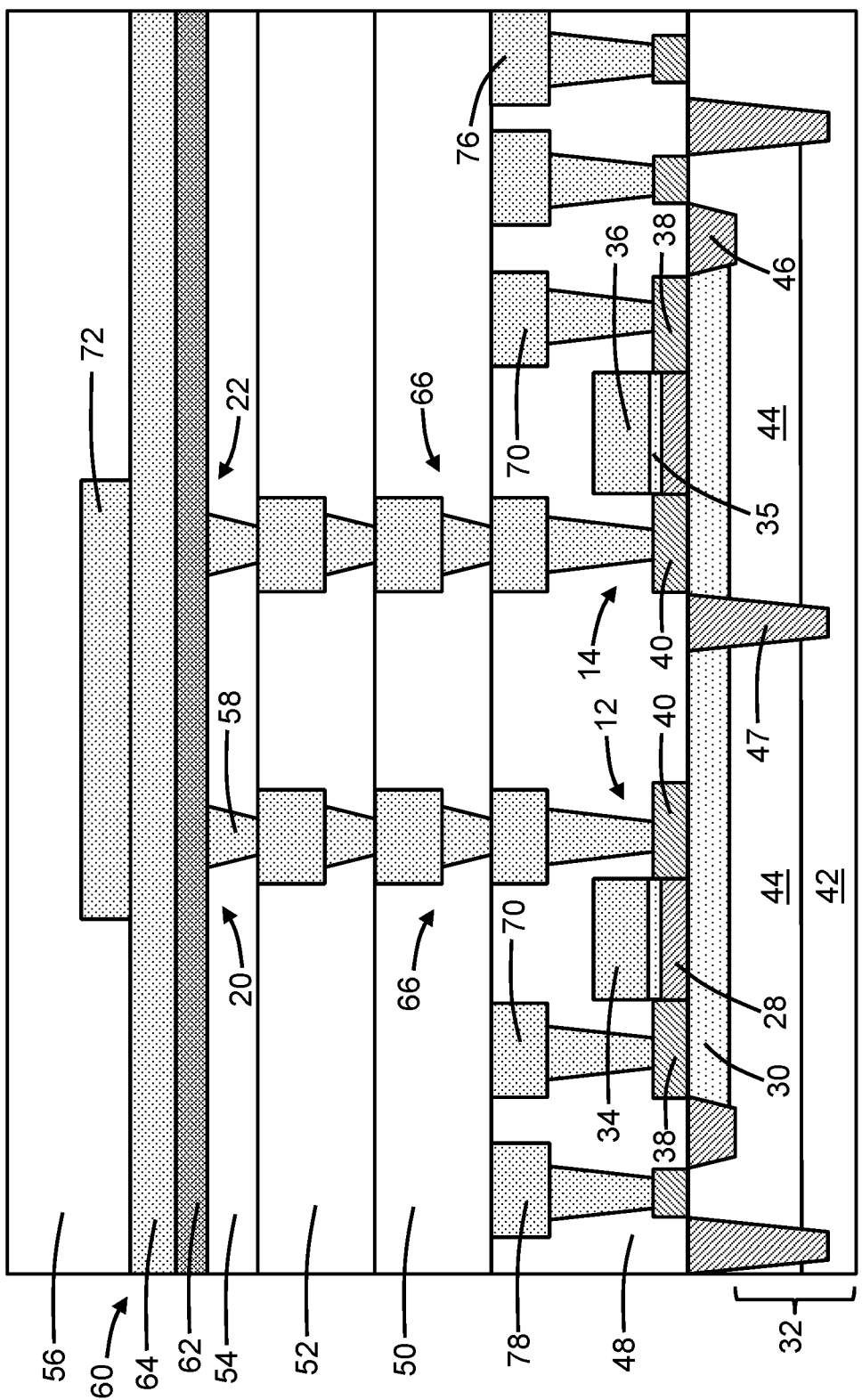
FIG. 2 is a cross-sectional view taken generally along line 2-2 in FIG. 1.
Figure 2A:
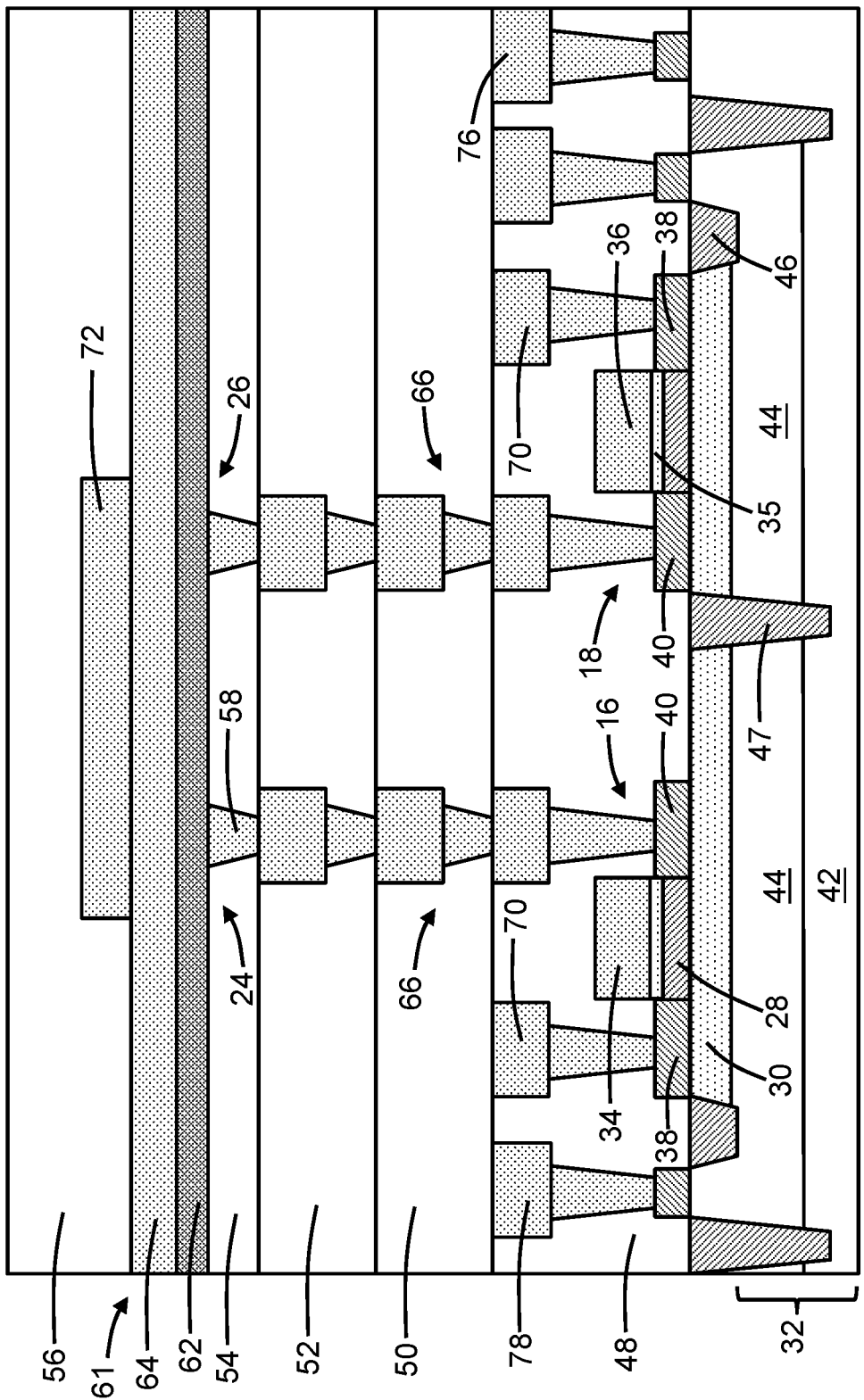
FIG. 2A is a cross-sectional view taken generally along line 2A-2A in FIG. 1.
Figure 3:
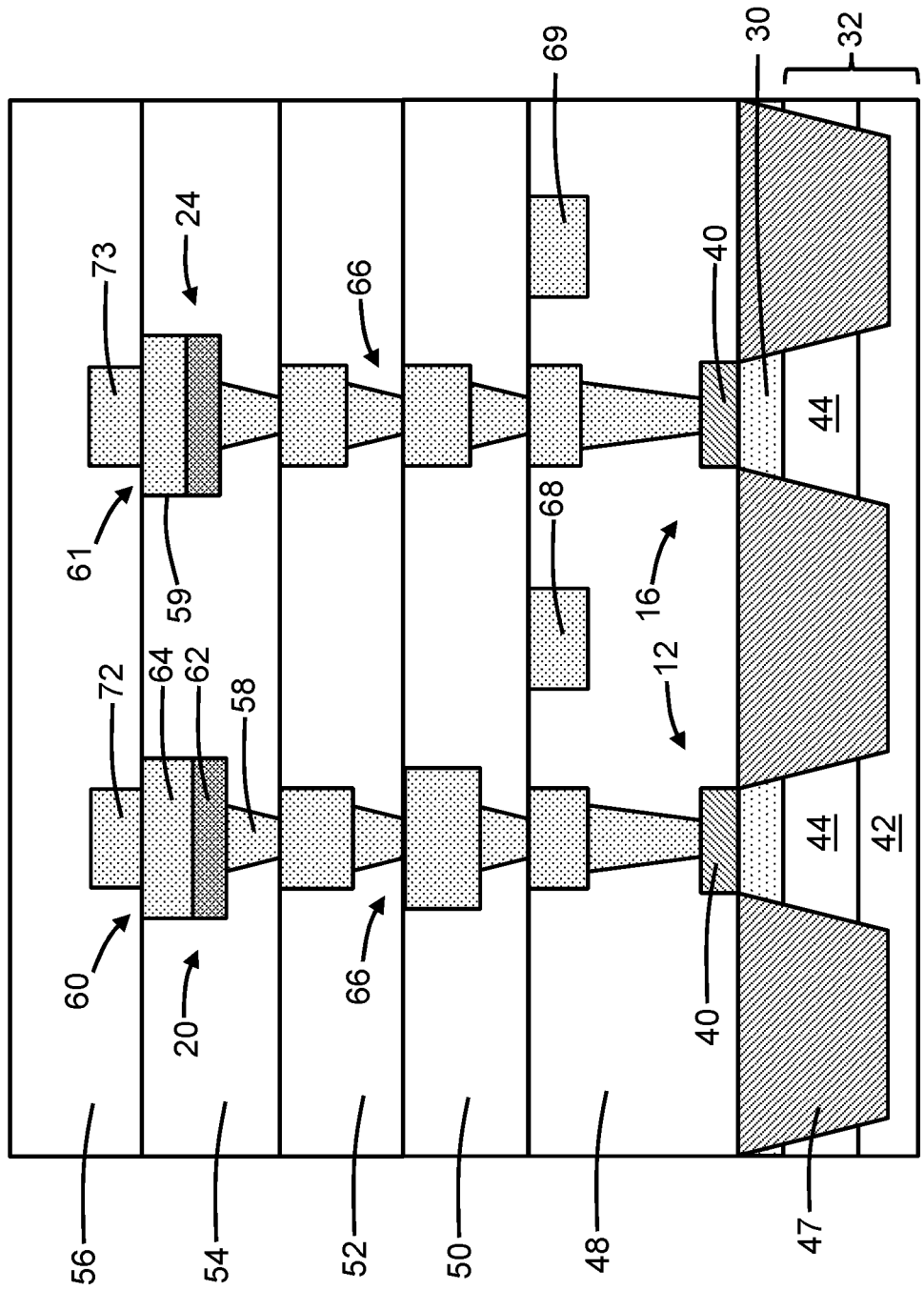
FIG. 3 is a cross-sectional view taken generally along line 3-3 in FIG. 1.
Figure 3A:
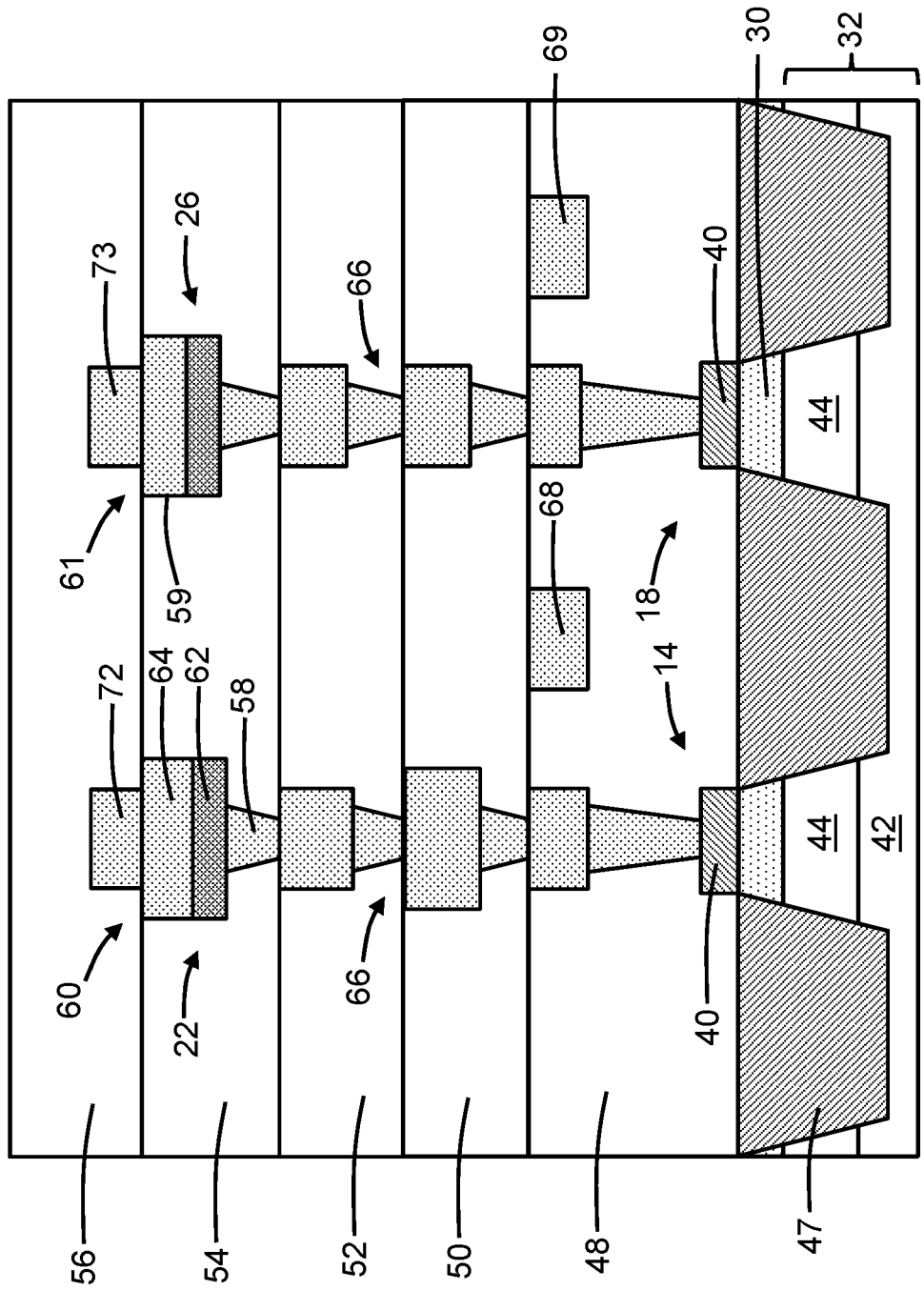
FIG. 3A is a cross-sectional view taken generally along line 3A-3A in FIG. 1.

With reference to FIGS. 1, 2, 2A, 3, 3A and in accordance with embodiments of the invention, a structure 10 for a resistive random-access memory device includes field-effect transistors 12, 14, 16, 18 and resistive memory elements 20, 22, 24, 26 that are respectively coupled to the field-effect transistors 12, 14, 16, 18 to define different bitcells. The field-effect transistors 12, 14, 16, 18, which provide access transistors for the bitcells, may be fabricated using a silicon-on-insulator substrate that includes a semiconductor layer 28, a dielectric layer 30, and a substrate 32. The semiconductor layer 28 is separated from the substrate 32 by the intervening dielectric layer 30. The semiconductor layer 28 may be comprised of a semiconductor material, such as single-crystal silicon, and may be intrinsic or lightly doped p-type. The dielectric layer 30 may be comprised of a dielectric material, such as silicon dioxide, that is an electrical insulator. The substrate 32 may be comprised of a semiconductor material, such as silicon, and may be lightly doped p-type. The dielectric layer 30 has an upper interface with the semiconductor layer 28, the dielectric layer 30 has a lower interface with the substrate 32, and the upper and lower interfaces are separated by the thickness of the dielectric layer 30. In an embodiment, the semiconductor layer 28 may have a thickness suitable to fabricate fully-depleted silicon-on-insulator (FDSOI) field-effect transistors. In an embodiment, the semiconductor layer 28 may have a thickness in a range of about 2 nanometers (nm) to about 20 nm. In an embodiment, the dielectric layer 30 may have a thickness in a range of about 10 nm to about 50 nm.

The field-effect transistor 12 and the field-effect transistor 16 may include a shared gate electrode 34 defining a word line, and the field-effect transistor 14 and the field-effect transistor 18 may include a shared gate electrode 36 defining another word line. The gate electrodes 34, 36 may be formed by depositing a layer stack and patterning the layer stack with photolithography and etching processes. The gate electrodes 34, 36 may be comprised of a conductor, such as doped polycrystalline silicon (i.e., doped polysilicon). A gate dielectric layer 35 comprised of an electrical insulator, such as silicon dioxide, may be disposed between the gate electrodes 34, 36 and the semiconductor layer 28. Each of the field-effect transistors 12, 14, 16, 18 may further include a source region 38 and a drain region 40 that may have raised portions of epitaxial semiconductor material, such as silicon or silicon-germanium, and that may contain, for example, an n-type dopant (e.g., arsenic or phosphorus).

A well 42 may be formed in the substrate 32 by introducing a dopant by, for example, a blanket ion implantation with given implantation conditions. The implantation conditions (e.g., ion species, dose, kinetic energy) may be selected to tune the electrical and physical characteristics of the well 42. In an embodiment, the well 42 may contain a concentration of an n-type dopant (e.g., arsenic or phosphorus) that provides n-type conductivity. The well 42 is accessible at the top surface of the semiconductor layer 28.

A well 44 may be formed in the substrate 32 by introducing a dopant by, for example, ion implantation with given implantation conditions. The well 44 is positioned in a vertical direction between the well 42 and the dielectric layer 30, and the well 44 is accessible at the top surface of the semiconductor layer 28. A patterned implantation mask may be formed to define a selected area that is exposed for the implantation of ions. The implantation mask may include a layer of an organic photoresist that is applied and patterned to form an opening exposing the selected area and determining, at least in part, the location and horizontal dimensions of the well 44. The implantation mask has a thickness and stopping power sufficient to block the implantation of ions in masked areas. The implantation conditions (e.g., ion species, dose, kinetic energy) may be selected to tune the electrical and physical characteristics of the well 44. In an embodiment, the well 44 may be doped (e.g., heavily doped) with a concentration of a p-type dopant (e.g., boron) to provide p-type conductivity.

Shallow trench isolation regions 46 and deep trench isolation regions 47 are formed that penetrate through the dielectric layer 30 and into the substrate 32. The deep trench isolation regions 47 extend to a greater depth in the substrate 32 than the shallow trench isolation regions 46. In particular, the deep trench isolation regions 47 may penetrate fully through the well 44 such that the well 44 includes an electrically-isolated section beneath each of the of the field-effect transistors 12, 14, 16, 18. The electrical isolation permits each section of the well 44 to be independently biased and, in particular, to be independently biased relative to the well 42.

The shallow trench isolation regions 46 may be formed by patterning shallow trenches with lithography and etching processes, depositing a dielectric material to fill the shallow trenches, and planarizing and/or recessing the dielectric material. The deep trench isolation regions 47 may be formed by patterning deep trenches with lithography and etching processes, depositing a dielectric material to fill the deep trenches, and planarizing and/or recessing the dielectric material. In an embodiment, the shallow trench isolation regions 46 and deep trench isolation regions 47 may contain a dielectric material, such as silicon dioxide, from a layer that is deposited by chemical vapor deposition and planarized by chemical-mechanical polishing.

With continued reference to FIGS. 1, 2, 2A, 3, 3A, an interconnect structure may be formed over the field-effect transistors 12, 14, 16, 18 and may include multiple metallization levels each having one or more dielectric layers 48, 50, 52, 54, 56. The one or more dielectric layers 48, 50, 52, 54, 56 in each metallization level may be comprised of a dielectric material, such as silicon dioxide or a low-k dielectric material, that is an electrical insulator.

The resistive memory elements 20, 22, 24, 26 are positioned in the interconnect structure and may arranged in an array characterized by rows and columns. Each of the resistive memory elements 20, 22, 24, 26 includes a bottom electrode 58 that may be formed in an opening patterned by lithography and etching processes in the one or more dielectric layers 54, and the bottom electrodes 58 may be contacts comprised of a metal, such as tantalum, titanium nitride, or tantalum nitride, or a combination thereof, that is deposited in the openings and planarized by chemical-mechanical polishing. The bottom electrodes 58 may be distributed in a plurality of rows, and the rows of bottom electrodes 58 may be aligned parallel to each other. Each bottom electrode 58 may define a cathode of one of the resistive memory elements 20, 22, 24, 26.

Strips 60, 61 that include a switching layer 62 and a top electrode layer 64 are positioned over the bottom electrodes 58. The switching layer 62 may be comprised of a metal oxide, such as hafnium oxide, magnesium oxide, tantalum oxide, titanium oxide, or aluminum oxide, or a dielectric material, such as silicon nitride or silicon dioxide. The top electrode layer 64 may be comprised of a metal, such as tungsten, titanium nitride, tantalum nitride, or platinum. The strips 60, 61, which are disconnected from each other, may be formed by depositing the switching layer 62 and top electrode layer 64 in a layer stack and patterning the layers 62, 64 with lithography and etching processes.

The strips 60, 61 are positioned with a side-by-side arrangement in which the gaps between adjacent pairs of strips 60, 61 are filled by dielectric material from the one or more dielectric layers 54. Each bottom electrode 58 is positioned in electrical and physical contact with the switching layer 62 of one of the strips 60, 61. The bottom electrodes 58 in each row of bottom electrodes 58 may be electrically and physically connected with the switching layer 62 of one of the strips 60, 61. The resistive memory elements 20, 22 share the strip 60 in which the top electrode layer 64 provides a common anode, and each of the resistive memory elements 20, 22 includes its own individual bottom electrode 58. Similarly, the resistive memory elements 24, 26 share the strip 61 in which the top electrode layer 64 provides a common contact or anode, and each of the resistive memory elements 24, 26 includes its own individual bottom electrode 58.

The metallization levels of the interconnect structure may include vertical interconnections 66 defined by a stack of contacts, via plugs, and metal features that physically and electrically connect the drain region 40 of the field-effect transistor 12 to the bottom electrode 58 of the resistive memory element 20, the drain region 40 of the field-effect transistor 14 to the bottom electrode 58 of the resistive memory element 22, the drain region 40 of the field-effect transistor 16 to the bottom electrode 58 of the resistive memory element 24, and the drain region 40 of the field-effect transistor 18 to the bottom electrode 58 of the resistive memory element 26. The interconnect structure also includes a bit line 68 that is physically and electrically connected by bit line fingers 70 to the source regions 38 of the field-effect transistors 12, 14, and the interconnect structure also includes a bit line 69 that is physically and electrically connected by bit line fingers 70 to the source regions 38 of the field-effect transistors 16, 18. The bit lines 68, 69 may be connected to peripheral circuits that include, for example, bit line drivers, a multiplexer, and a sense amplifier. The word lines defined by the gate electrodes 34, 36 may be connected to peripheral circuits that include, for example, word line drivers.

The strips 60, 61, which provide the anodes of the resistive memory elements 20, 22, 24, 26, are longitudinally aligned in the same direction as the bit lines 68, 69. In an embodiment, the strips 60, 61 may be longitudinally aligned parallel to the bit lines 68, 69. The word lines defined by the gate electrodes 34, 36 are longitudinally aligned in a different direction from the strips 60, 61. In an embodiment, the gate electrodes 34, 36 defining the word lines may be longitudinally aligned transverse (i.e., perpendicular) to the strips 60, 61. The parallel alignment of the strips 60, 61 with the bit lines 68, 69 and the transverse alignment of the gate electrodes 34, 36 defining the word lines with the strips 60, 61 and the bit lines 68, 69 enables the adaptive back biasing that is described below.

Each of the strips 60, 61 is fully surrounded by a perimeter 59. Metal features 72, 73 are formed in a metallization level of the interconnect structure that is positioned over the strips 60, 61. In an embodiment, the metal feature 72 may be in direct contact with (i.e., directly land on) the strip 60 and the metal feature 73 may be in direct contact with (i.e., directly land on) the strip 61, which establishes respective via-less connections between the metal features 72, 73 and the strips 60, 61. The metal feature 72 overlaps with the strip 60 such that the metal feature 72 is positioned inside a border or edge defined by the perimeter 59 of the strip 60 and, as a result, the metal feature 72 is fully enclosed within the strip 60. The metal feature 73 overlaps with the strip 61 such that the metal feature 73 is positioned inside a border or edge defined by the perimeter 59 of the strip 61 and, as a result, the metal feature 73 is fully enclosed within the strip 61.

The interconnect structure may further include connections 76 commonly connected to the well 42 and connections 78 that are independently connected to the different isolated sections of the well 44. Each section of the well 44 is electrically isolated from adjacent sections of the well 44 by the deep trench isolation regions 47 and the underlying well 42. The independent connection 78 to each isolated section of the well 44 permits each isolated section of the well 44 to be biased independently of the other isolated sections of the well 44, which enables an adaptive body biasing scheme. For example, a voltage may be applied to the word line defined by the gate electrode 34 to select the field-effect transistor 12 for an operation (e.g., an erase) and the word line defined by the gate electrode 36 may be grounded, the isolated section of the well 44 beneath the field-effect transistor 12 and the well 42 may be forward biased by applying a voltage to the isolated section of the well 44, and the well 42 and the isolated sections of the well 44 beneath the non-selected field-effect transistors 14, 18 associated with inactive bitcells may be reverse biased by applying a voltage of opposite polarity to the isolated sections of the well 44. The isolated sections of the well 44 are oriented and decoded in the same direction as the word line defined by the gate electrode 34. The non-selected field-effect transistors 14, 18 are effectively biased to a voltage level equal to a fraction of the word line voltage, which operates to minimize overdrive stress.

The adaptive body biasing scheme may be effective to improve device performance and lower leakage. The adaptive body biasing scheme may also be effective to mitigate the stress voltages applied to the non-selected field-effect transistors, in this example the non-selected field-effect transistors 14, 18, which may permit reductions in the thickness of the gate dielectric layer 35.

The strips 60, 61 providing anodes of the resistive memory elements 20, 22, 24, 26 may be patterned using a non-critical mask, which may limit the cost of forming the anodes in the form of strips 60, 61 in comparison with conventional anodes. The reliability risk may be reduced by the adaptive biasing scheme enabled by the sectioning of the well 44 with the deep trench isolation regions 47. The structure 10 is scalable for reducing the bitcell area with minimal risk of misalignment.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. The chip may be integrated with other chips, discrete circuit elements, and/or other signal processing devices as part of either an intermediate product or an end product. The end product can be any product that includes integrated circuit chips, such as computer products having a central processor or smartphones.

References herein to terms modified by language of approximation, such as "about", "approximately", and "substantially", are not to be limited to the precise value specified. The language of approximation may correspond to the precision of an instrument used to measure the value and, unless otherwise dependent on the precision of the instrument, may indicate a range of +/−10% of the stated value(s).

References herein to terms such as "vertical", "horizontal", etc. are made by way of example, and not by way of limitation, to establish a frame of reference. The term "horizontal" as used herein is defined as a plane parallel to a conventional plane of a semiconductor substrate, regardless of its actual three-dimensional spatial orientation. The terms "vertical" and "normal" refer to a direction perpendicular to the horizontal, as just defined. The term "lateral" refers to a direction within the horizontal plane.

A feature "connected" or "coupled" to or with another feature may be directly connected or coupled to or with the other feature or, instead, one or more intervening features may be present. A feature may be "directly connected" or "directly coupled" to or with another feature if intervening features are absent. A feature may be "indirectly connected" or "indirectly coupled" to or with another feature if at least one intervening feature is present. A feature "on" or "contacting" another feature may be directly on or in direct contact with the other feature or, instead, one or more intervening features may be present. A feature may be "directly on" or in "direct contact" with another feature if intervening features are absent. A feature may be "indirectly on" or in "indirect contact" with another feature if at least one intervening feature is present. Different features may "overlap" if a feature extends over, and covers a part of, another feature.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure comprising:
a semiconductor substrate;
a first plurality of resistive memory elements including a first plurality of bottom electrodes, a first top electrode, and a first switching layer between the first top electrode and the first plurality of bottom electrodes, the first top electrode shared by the first plurality of resistive memory elements;
a second plurality of resistive memory elements including a second plurality of bottom electrodes, a second top electrode, and a second switching layer between the second top electrode and the second plurality of bottom electrodes, the second top electrode shared by the second plurality of resistive memory elements;
a plurality of field-effect transistors, each of the plurality of field-effect transistors including a drain region that is respectively connected to one of the first plurality of bottom electrodes;
a dielectric layer positioned between the plurality of field-effect transistors and the semiconductor substrate;
a first well in the semiconductor substrate; and
a plurality of deep trench isolation regions penetrating fully through the dielectric layer and fully through the first well to divide the first well into a plurality of isolated sections, each isolated section of the first well positioned beneath one of the plurality of field-effect transistors.

2. The structure of claim 1 wherein the first top electrode is surrounded by a first perimeter, and further comprising:
a first metal feature connected to the first top electrode with a first overlapping arrangement, the first metal feature fully enclosed within the first perimeter of the first top electrode.

3. The structure of claim 2 wherein the first top electrode is positioned in a vertical direction between the first metal feature and the first switching layer.

4. The structure of claim 2 wherein the first metal feature directly contacts the first top electrode to form a via-less connection.

5. The structure of claim 4 wherein the first metal feature is connected to the first top electrode without an intervening via.

6. The structure of claim 2 wherein the second top electrode is surrounded by a second perimeter, and further comprising:
a second metal feature connected to the second top electrode with a second overlapping arrangement, the second metal feature fully enclosed within the second perimeter of the second top electrode.

7. The structure of claim 6 wherein the first top electrode is positioned in a vertical direction between the first metal feature and the first switching layer, and the second top electrode is positioned in the vertical direction between the second metal feature and the second switching layer.

8. The structure of claim 6 wherein the first metal feature directly contacts the first top electrode, and the second metal feature directly contacts the second top electrode.

9. The structure of claim 1 wherein the first well has a first conductivity type, and further comprising:
a second well in the semiconductor substrate, the second well having a second conductivity type opposite to the first conductivity type,
wherein the plurality of deep trench isolation regions penetrate into the second well.

10. The structure of claim 1 further comprising:
a plurality of shallow trench isolation regions penetrating fully through the dielectric layer.

11. The structure of claim 1 wherein the plurality of isolated sections of the first well are configured to be independently biased.

12. The structure of claim 1 further comprising:
a bit line longitudinally aligned parallel to the first top electrode and the second top electrode,
wherein each of the plurality of field-effect transistors includes a source region that is respectively connected to the bit line.

13. The structure of claim 12 wherein the plurality of field-effect transistors include a shared gate electrode defining a word line, and the word line is longitudinally aligned transverse to the bit line.

14. The structure of claim 1 wherein the first plurality of bottom electrodes are arranged in a first row, and the first top electrode is longitudinally aligned parallel to the first row.

15. The structure of claim 14 wherein the second plurality of bottom electrodes are arranged in a second row, and the second top electrode is longitudinally aligned parallel to the second row.

16. The structure of claim 1 wherein the first top electrode and the second top electrode are separated by a gap.

17. The structure of claim 1 wherein the first top electrode is surrounded by a perimeter, and further comprising:
a first metal feature connected to the first top electrode with a first overlapping arrangement, the first metal feature having a perimeter positioned inside the perimeter of the first top electrode.

18. The structure of claim 1 wherein each of the first plurality of resistive memory elements includes one of the first plurality of bottom electrodes, and each of the second plurality of resistive memory elements includes one of the second plurality of bottom electrodes.

19. A method comprising:
forming a first plurality of resistive memory elements including a first plurality of bottom electrodes, a first top electrode, and a first switching layer between the first top electrode and the first plurality of bottom electrodes, wherein the first top electrode are shared by the first plurality of resistive memory elements;
forming a second plurality of resistive memory elements including a second plurality of bottom electrodes, a second top electrode, and a second switching layer between the second top electrode and the second plurality of bottom electrodes, wherein the second top electrode is shared by the second plurality of resistive memory elements;
forming a plurality of field-effect transistors, wherein each of the plurality of field-effect transistors including a drain region that is respectively connected to one of the first plurality of bottom electrodes, and a dielectric layer is positioned between the plurality of field-effect transistors and a semiconductor substrate;
forming a well in the semiconductor substrate; and
forming a plurality of deep trench isolation regions penetrating fully through the dielectric layer and fully through the well to divide the well into a plurality of isolated sections, wherein each isolated section of the well is positioned beneath one of the plurality of field-effect transistors.

20. The method of claim 19 wherein the first top electrode is surrounded by a first perimeter, and further comprising:

forming a metal feature connected to the first top electrode with an overlapping arrangement,
wherein the metal feature is enclosed within the first perimeter of the first top electrode.

\* \* \* \* \*